United States Patent Office 3,676,240

Patented July 11, 1972

3,676,240

METHOD OF ETCHING MATERIALS CAPABLE OF BEING ETCHED WITH HYDROFLUORIC ACID

Theodore Frank Retajczyk, Jr., North Plainfield, N.J., assignor to Bell Telephone Laboratories, Incorporated, Murray Hill and Berkeley Heights, N.J.

No Drawing. Filed Apr. 14, 1970, Ser. No. 28,505
Int. Cl. H01l 7/50
U.S. Cl. 156—17 13 Claims

ABSTRACT OF THE DISCLOSURE

A method for etching the oxides of silicon and other materials capable of being etched with aqueous hydrofluoric acid is described. The material to be etched is treated with an etching solution comprising (a) an etchant having the general formula $R_4NH_{x+1}F_{y+2}$, wherein $x$ and $y$ may be 0 or 1, and $x$ and $y$ are equal, and wherein R may be a hydrogen radical or an organic radical represented as $C_nH_{2n+1}$ wherein $n$ is an integer from 1 to 10, and (b) a suitable solvent for the etchant.

BACKGROUND OF THE INVENTION

(1) Field of the invention

This invention relates to a method of etching materials capable of being etched with hydrofluoric acid and more particularly to etching the oxides of semiconductor materials.

(2) Description of the prior art

In preparing semiconductive bodies for use in circuit elements, $SiO_2$ is often used as a masking agent. Hydrofluoric acid is the most common etchant for $SiO_2$ as well as for other inorganic oxides. However, the use of aqueous hydrofluoric acid presents many problems, one of which is the inherent hazard involved. An etching constituent, which is in salt form prior to its use, would be easier and safer to handle.

The removal of oxides from inorganic surfaces by etching with aqueous hydrofluoric acid, e.g., in the etching of $SiO_2$, may be considered as an hydrolysis at an oxidized silicon surface, as represented by Equation 1, followed by a fluorination as represented by Equation 2:

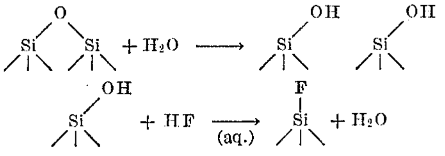

(1)

(2)

However, there is a possibility that a significant portion of the substrate is still hydroxylated even in the presence of hydrofluoric acid. The substitution of a nonaqueous solvent for water would reduce the degree of surface hydrolysis. Also, the use of an organic solvent would promote more uniform etching behavior, since any residual organics on the surface would be more soluble in an organic reagent. The organic solvent wets the surface better and promotes more intimate contact between the surface to be etched and the etchant.

SUMMARY OF THE INVENTION

The present invention is directed to a method for etching materials with etchants which are suitable substitutes for hydrofluoric acid. Briefly, the inventive technique involves the use of solid etchants, i.e., in salt form, having the general formula $R_4NH_{x+1}F_{y+2}$ wherein R may be a hydrogen radical or an organic radical and wherein $x$ and $y$ may be 0 or 1 and $x$ equals $y$. Etching is effected by dissolving the salt in a suitable organic solvent and immersing the substrate to be etched therein for a period of time sufficient to etch or remove the requisite amount of material from the surface areas of the substrate.

DETAILED DESCRIPTION

The present invention has been described largely in terms of the etching of a $SiO_2$ coated silicon substrate. However, it will be understood that such description is for purposes of exposition and not for purposes of limitation. It will be readily appreciated that the inventive concept described is equally applicable to etching any material capable of being etched with hydrofluoric acid, including inorganic oxides generally and $SiO_2$, $GeO_2$, and $GeO_2$ coated germanium substrates in particular.

A general description of the inventive etching technique will now be given. The nature of the starting materials and operating parameters have been indicated.

A salt having the general formula $R_4NH_{x+1}F_{y+2}$, wherein $x$ is 0 or 1, $y$ is 0 or 1 and $x$ equals $y$ and wherein R is hydrogen or an organic radical represented as $C_nH_{2n+1}$ wherein $n$ is an integer from 1–10, is selected. The selected salt is then weighed out and dissolved in a suitable solvent or a combination of suitable solvents. Suitable solvents are those capable of dissolving and dissociating salts of the aforementioned types. Typical organic solvents satisfactory for this purpose are formamide, N-methylformamide, dimethylformamide, N-methylacetamide, dimethylacetamide, dimethylsulfoxide, acetonitrile and mixtures thereof. The concentration of the resulting etching solution is limited only by the organic etchant and solvent employed. However, in practice, the highest concentration is limited by the etching rate desired with the particular material to be etched or by the solubility of the salt at a given temperature, whereas the lowest concentration range is limited by the inconvenience of preparation.

The substrate to be treated, e.g., $SiO_2$ coated silicon, is immersed in the etching solution wherein the $SiO_2$ is selectively etched. The temperature of the etching solution is maintained from room temperature to the boiling point of the particular solvent selected. In this regard, the temperature selected depends upon the parameters, such as the solvent employed, the material to be etched and the etch rate desired. After the substrate has been immersed in the etching solution for the requisite period of time, it is removed therefrom and rinsed with a suitable organic solvent, e.g., methanol, and then dried.

The time period in which the substrate is immersed in the solution depends upon the rate of etch of the oxide coat and the amount of oxide to be removed. The rate of etch parameter can be experimentally determined by one skilled in the art. In determining the etch rate a typical material to be etched, e.g., oxidized silicon, is weighed on a micro balance. The substrate is then etched in a given solution for a period of time after which it is rinsed with methanol and dried in an oven for 15 minutes at 115° C. The dried etched substrate is then reweighed and the etching rate in angstroms per minute calculated, knowing the weight loss of $SiO_2$, the diameter of the slice, the density of $SiO_2$ and the etching time. In the alternative, the rate can be determined by simply measuring the oxide thickness before and after the actual etching process via ellipsometry or by interference techniques.

In a separate embodiment, $(CH_3)_4NH_2F_3$ is dissolved in water to form an etching solution. The parameters of concentration and temperature are limited by the same considerations enumerated above and the procedure is the same as indicated in the previous embodiment.

Specific examples for the etching of inorganic oxides are as follows:

EXAMPLE 1

5.7 grams of purified $NH_4HF_2$, commercially obtained was weighed out and added to 100 ml. of formamide to form a 1 molar etching solution. The formamide was of the highest purity commercially available and contained less than 0.05 percent water. The resultant etching solution was maintained in a dry inert ambient. A silicon slice, having 1 micron of $SiO_2$ on each side, was immersed in the etching solution which was maintained at 25° C. The selective etch rate of the $SiO_2$ was determined to be 130 A. per minute.

EXAMPLE 2

The procedure of Example 1 was repeated with the exception that the etching solution was maintained at 51° C. during the etching step. The selective etch rate of the $SiO_2$ was determined to be 600 A. per minute.

EXAMPLE 3

The procedure of Example 1 was repeated with the exception that the etching solution was maintained at 73° C. during the etching step. The selective etch rate of the $SiO_2$ was determined to be 2100 A. per minute.

EXAMPLE 4

The procedure of Example 1 was repeated with the exception that the etching solution was maintained at 85° C. during the etching step. The selective etch rate of the $SiO_2$ was determined to be 4500 A. per minute.

EXAMPLE 5

The procedure of Example 1 was repeated with the exception that the etching solution was maintained at 95° C. during the etching step. The selective etch rate of the $SiO_2$ was determined to be 111,000 A. per minute.

EXAMPLE 6

The procedure of Example 1 was repeated with the exception that the etching solution was maintained at 105° C. during the etching step. The selective etch rate of the $SiO_2$ was determined to be 111,000 A. per minute.

EXAMPLE 7

The procedure of Example 1 was repeated with the exception that the etching solution was maintained at 121° C. during the etching step. The selective etch rate of the $SiO_2$ was determined to be 23,000 A. per minute.

EXAMPLE 8

0.12 gram of purified $NH_4HF_2$, commercially obtained, was weighed out and added to 100 ml. of N-methylformamide to form a 0.2 molar etching solution. The N-methylformamide was of the highest purity commercially available and contained less than 0.05 percent water. The resultant etching solution was maintained in a dry inert ambient. A silicon slice, having 1 micron of $SiO_2$ on each side, was immersed in the etching solution maintained at 25° C. The selective etch rate of the $SiO_2$ was determined to be 34 A. per minute.

EXAMPLE 9

A saturated solution of the $NH_4HF_2$ in dimethylformamide, saturated at 125° C., was prepared. The purified $NH_4HF_2$ was commercially obtained and the dimethylformamide was of the highest purity commercially available and contained less than 0.05 percent water. The resultant etching solution was maintained in a dry inert ambient. A silicon slice, having 1 micron of $SiO_2$ on each side, was immersed in the etching solution maintained at 125° C. The selective etch rate of the $SiO_2$ was determined to be 20 A. per minute.

EXAMPLE 10

0.03 gram of purified $NH_4HF_2$ commercially obtained was weighed out and added to 100 ml. of N-methylacetamide to form a 0.05 molar etching solution. The N-methylacetamide was of the highest purity commercially available and contained less than 0.05 percent water. The resultant etching solution was maintained in a dry inert ambient. A silicon slice, having 1 micron of $SiO_2$ on each side, was immersed in the etching solution maintained at 25° C. The selective etch rate of the the $SiO_2$ was determined to be 16 A. per minute.

EXAMPLE 11

A saturated solution of $NH_4HF_2$ in dimethylsulfoxide, saturated at 92° C., was prepared. The purified $NH_4HF_2$ was commercially obtained and the dimethylsulfoxide was of the highest purity commercially available and contained less than 0.05 percent water. The resultant etching solution was maintained in a dry inert ambient. A silicon slice, having 1 micron of $SiO_2$ on each side, was immersed in the etching solution maintained at 92° C. The selective etch rate of the $SiO_2$ was determined to be 40 A. per minute.

EXAMPLE 12

A saturated solution of $NH_4HF_2$ in acetonitrile, saturated at 80° C., was prepared. The purified $NH_4HF_2$ was commercially obtained and the acetonitrile was of the highest purity commercially available and contained less than 0.05 percent water. The resultant etching solution was maintained in a dry inert ambient. A silicon slice, having 1 micron of $SiO_2$ on each side, was immersed in the etching solution maintained at 80° C. The selective etch rate of the $SiO_2$ was determined to be 110 A. per minute.

EXAMPLE 13

11.3 grams of $(CH_3)_4NH_2F_3$, custom synthesized, was weighed out and added to 100 ml. of formamide to form a 1 molar solution. The formamide was of the highest purity commercially available and contained less than 0.05 percent water. The resultant 1 molar etching solution was maintained in a dry, inert ambient. A silicon slice, having 1 micron of $SiO_2$ on each side, was immersed in the etching solution maintained at 25° C. The selective etch rate of the $SiO_2$ was determined to be 90 A. per minute.

EXAMPLE 14

11.3 grams of $(CH_3)_4NH_2F_3$, custom synthesized, was weighed out and added to 100 ml. of N-methylformamide to form a 1 molar solution. The N-methylformamide was of the highest purity commercially available and contained less than 0.05 percent water. The resultant 1 molar etching solution was maintained in a dry, inert ambient. A silicon slice having 1 micron of $SiO_2$ on each side, was immersed in the etching solution maintained at 25° C. The selective etch rate of the $SiO_2$ was determined to be 1.6 A. per minute.

EXAMPLE 15

11.3 grams of $(CH_3)_4NH_2F_3$, custom synthesized, was weighed out and added to 100 ml. of dimethylformamide to form a 1 molar solution. The dimethylformamide was of the highest purity commercially available and contained less than 0.05 percent water. The resultant 1 molar etching solution was maintained in a dry, inert ambient. A silicon slice having 1 micron of $SiO_2$ on each side, was immersed in the etching solution maintained at 25° C. The selective etch rate of the $SiO_2$ was determined to be 1.6 A. per minute.

EXAMPLE 16

6 grams of $(CH_3)_4NH_2F_3$, custom synthesized, was weighed out and added to 100 ml. of N-methylacetamide to form a saturated solution at 105° C. The N-methylacetamide was of the highest purity commercially available and contained less than 0.05 percent water. The resultant saturated solution was maintained in a dry, inert ambient. A silicon slice, having 1 micron of $SiO_2$ on each side, was immersed in the etching solution maintained at 105° C. The selective etch rate of the $SiO_2$ was determined to be 1600 A. per minute.

EXAMPLE 17

1.4 grams of $(CH_3)_4NH_2F_3$, custom synthesized, was weighed out and added to 100 ml. of dimethylacetamide to form a 0.25 molar solution. The dimethylacetamide was of the highest purity commercially available and contained less than 0.05 percent water. The resultant 0.25 molar etching solution was maintained in a dry, inert ambient. A silicon slice, having 1 micron of $SiO_2$ on each side, was immersed in the etching solution maintained at 88° C. The selective etch rate of the $SiO_2$ was determined to be 12 A. per minute.

EXAMPLE 18

5.65 grams of $(CH_3)_4NH_2F_3$, custom synthesized, was weighed out and added to 100 ml. of dimethylsulfoxide to form a 0.5 molar solution. The dimethylsulfoxide was of the highest purity commercially available and contained less than 0.05 percent water. The resultant 0.5 molar etching solution was maintained in a dry, inert ambient. A silicon slice, having 1 micron of $SiO_2$ on each side, was immersed in the etching solution maintained at 880 C. The selective etch rate of the $SiO_2$ was determined to be 180 A. per minute.

EXAMPLE 19

9.0 grams of $(CH_3)_4NH_2F_3$, custom synthesized, was weighed out and added to 100 ml. of acetonitrile to form a 0.8 molar solution. The acetonitrile was of the highest purity commercially available and contained less than 0.05 percent water. The resultant 0.8 molar etching solution was maintained in a dry, inert ambient. A silicon slice, having 1 micron of $SiO_2$ on each side, was immersed in the etching solution maintained at 25° C. The selective etch rate of the $SiO_2$ was determined to be 10 A. per minute.

EXAMPLE 20

The procedure of Example 19 was repeated with the exception that a saturated solution of $(CH_3)_4NH_2F_3$ in acetonitrile, saturated at 80° C., was employed and the etching solution was maintained at 80° C. during the etching step. The selective etch rate of $SiO_2$ was determined to be 30 A. per minute.

EXAMPLE 21

11 grams of $(CH_3)_4NH_2F_3$, custom synthesized, was weighed out and added to 100 ml. of water to form a 1 molar solution. A silicon slice, having 1 micron of $SiO_2$ on each side, was immersed in the resulting 1 molar etching solution which was maintained at 25° C. The selective etch rate of the $SiO_2$ was determined to be 240 A. per minute.

EXAMPLE 22

17 grams of $(C_2H_5)_4NHF_2$, custom synthesized, was weighed out and added to 100 ml. of formamide to form a 1 molar solution. The formamide was of the highest purity commercially available and contained less than 0.05 percent water. The resultant 1 molar etching solution was maintained in a dry, inert ambient. A silicon slice, having 1 micron of $SiO_2$ on each side, was immersed in the etching solution maintained at 25° C. The selective etch rate of the $SiO_2$ was determined to be 26 A. per minute.

EXAMPLE 23

17 grams of $(C_2H_5)_4NHF_2$, custom synthesized, was weighed out and added to 100 ml. of N-methylformamide to form a 1 molar solution. The N-methylformamide was of the highest purity commercially available and contained less than 0.05 percent water. The resultant 1 molar etching solution was maintained in a dry, inert ambient. A silicon slice, having 1 micron of $SiO_2$ on each side, was immersed in the etching solution maintained at 25° C. The selective etch rate of the $SiO_2$ was determined to be 17 A. per minute.

EXAMPLE 24

17 grams of $(C_2H_5)_4NHF_2$, custom synthesized, was weighed out and added to 100 ml. of N-methylacetamide to form a 1 molar solution. The N-methylacetamide was of the highest purity commercially available and contained less than 0.05 percent water. The resultant 1 molar etching solution was maintained in a dry, inert ambient. A silicon slice, having 1 micron of $SiO_2$ on each side, was immersed in the etching solution maintained at 25° C. The selective etch rate of the $SiO_2$ was determined to be 3.3 A. per minute.

What is claimed is:

1. A method for etching an oxide selected from the group consisting of silicon dioxide and germanium dioxide, which comprises contacting the material with an aqueous solution of $(CH_3)_4NH_2F_3$ having a concentration ranging from 0.2 molar to saturation.

2. The method as defined in claim 1 wherein said material is $SiO_2$.

3. A method for the selective removal of an oxide selected from the group consisting of silicon dioxide and germanium dioxide, which comprises contacting the surfaces of the semiconductor material with an aqueous solution of $(CH_3)_4NH_2F_3$ having a concentration ranging from 0.2 molar to saturation.

4. A method for etching an oxide selected from the group consisting of silicon dioxide and germanium dioxide, which comprises contacting said oxide with an etchant having a concentration ranging from 0.2 molar to saturation comprising (a) a compound of the general formula $R_4NH_{x+1}F_{y+2}$, wherein $x$ and $y$ are equal in value and range from 0 to 1, and R is selected from the group consisting of $CH_3$ and $C_2H_5$ radicals and hydrogen, and (b) an organic solvent selected from the group consisting of formamide, N-methylformamide, N-methylacetamide, dimethylsulfoxide, acetonitrile, dimethylformamide, dimethylacetamide and mixtures thereof.

5. The method as defined in claim 3 wherein said inorganic oxide is $SiO_2$.

6. A method for selectively removing an oxide selected from the group consisting of silicon dioxide and germanium dioxide from the surface of a semiconductor material which comprises contacting said surface with an etchant having a concentration ranging from 0.2 molar to saturation comprising (a) a compound of the general formula $R_4NH_{x+1}F_{y+2}$, wherein $x$ and $y$ are equal in value and range from 0 to 1, and R is selected from the group consisting of $CH_3$ and $C_2H_5$ radicals and hydrogen, and (b) an organic solvent selected from the group consisting of formamide, N-methylformamide, N-methylacetamide, dimethylsulfoxide, acetontrile, dimethylformamide, dimethylacetamide and mixtures thereof.

7. The method as defined in claim 4 wherein $x$ and $y$ are 0 and R is hydrogen.

8. The method as defined in claim 4 wherein $x$ and $y$ are 0 and R is $C_2H_5$.

9. The method as defined in claim 4 wherein $x$ and $y$ are 1 and R is $CH_3$.

10. The method as defined in claim 4 wherein said material to be etched is $SiO_2$.

11. The method as defined in claim 6 wherein $x$ and $y$ are 0 and R is hydrogen.

12. The method as defined in claim 6 wherein $x$ and $y$ are 0 and R is $C_2H_5$.

13. The method as defined in claim 6 wherein $x$ and $y$ are 1 and R is $CH_3$.

References Cited

UNITED STATES PATENTS

| | | | |
|---|---|---|---|
| 382,318 | 5/1888 | Nienstadt | 252—79.3 |
| 2,278,257 | 3/1942 | Gallagher | 252—79.3 |
| 3,107,188 | 10/1963 | Hancock | 252—79.3 XR |
| 3,497,407 | 2/1970 | Esch et al. | 252—79.3 XR |

OTHER REFERENCES

Uses And Applications of Chemicals And Related Materials by Rheinhardt Publg. Co., copyright 1939.

JACOB H. STEINBERG, Primary Examiner

U.S. Cl. X.R.

252—79.3, 79.4, 162